(12) United States Patent
Hahakura et al.

(10) Patent No.: US 12,267,950 B2
(45) Date of Patent: Apr. 1, 2025

(54) FLEXIBLE PRINTED WIRING BOARD AND BATTERY WIRING MODULE

(71) Applicants: SUMITOMO ELECTRIC PRINTED CIRCUITS, INC., Koka (JP); SUMITOMO ELECTRIC INDUSTRIES, LTD., Osaka (JP); SUMITOMO WIRING SYSTEMS, LTD., Mie (JP); AUTONETWORKS TECHNOLOGIES, LTD., Mie (JP)

(72) Inventors: Shuji Hahakura, Koka (JP); Shinichi Takase, Yokkaichi (JP); Yoshifumi Uchita, Koka (JP); Hideo Takahashi, Yokkaichi (JP)

(73) Assignees: SUMITOMO ELECTRIC PRINTED CIRCUITS, INC., Shiga (JP); SUMITOMO ELECTRIC INDUSTRIES, LTD., Osaka (JP); SUMITOMO WIRING SYSTEMS, LTD., Mie (JP); AUTONETWORKS TECHNOLOGIES, LTD., Mie (JP)

( * ) Notice: Subject to any disclaimer, the term of this patent is extended or adjusted under 35 U.S.C. 154(b) by 367 days.

(21) Appl. No.: 17/625,037

(22) PCT Filed: Jul. 9, 2020

(86) PCT No.: PCT/JP2020/026936
§ 371 (c)(1),
(2) Date: Jan. 5, 2022

(87) PCT Pub. No.: WO2021/006323
PCT Pub. Date: Jan. 14, 2021

(65) Prior Publication Data
US 2022/0295631 A1    Sep. 15, 2022

(30) Foreign Application Priority Data
Jul. 10, 2019  (JP) .................................. 2019-128673

(51) Int. Cl.
*H05K 1/02* (2006.01)
*H01M 50/519* (2021.01)
(Continued)

(52) U.S. Cl.
CPC ........ *H05K 1/0283* (2013.01); *H01M 50/519* (2021.01); *H05K 1/0265* (2013.01);
(Continued)

(58) Field of Classification Search
None
See application file for complete search history.

(56) References Cited

U.S. PATENT DOCUMENTS

D845,889 S  *  4/2019  Guzie .......................... D13/102
2017/0236960 A1* 8/2017  Tourino .............. H01L 31/0687
                                                           136/256
(Continued)

FOREIGN PATENT DOCUMENTS

| JP | 2004-071562 A | 3/2004 |
| JP | 2005-192381 A | 7/2005 |
| JP | 2013-161506 A | 8/2013 |

*Primary Examiner* — Ishwarbhai B Patel
(74) *Attorney, Agent, or Firm* — Oliff PLC

(57) ABSTRACT

A flexible printed wiring board according to an aspect includes a base film, a conductive pattern disposed on one surface of the base film, and an extra length absorbing portion protruding from the base film and disposed in a direction of a plane, the extra length absorbing portion including a pattern connected portion connected to the conductive pattern, a coupling portion having a first linear wiring portion, a first arcuate wiring portion, and a second linear wiring portion coupled in this order continuously from the pattern connected portion, and a connecting terminal connected to the coupling portion, the pattern connected
(Continued)

portion and the connecting terminal being opposite to each other in a direction in which the extra length absorbing portion protrudes.

7 Claims, 9 Drawing Sheets

(51) Int. Cl.
*H05K 1/03* (2006.01)
*H05K 1/11* (2006.01)
*H05K 1/18* (2006.01)

(52) U.S. Cl.
CPC ........... *H05K 1/028* (2013.01); *H05K 1/0393* (2013.01); *H05K 1/189* (2013.01); *H05K 1/0213* (2013.01); *H05K 1/0271* (2013.01); *H05K 1/11* (2013.01); *H05K 1/18* (2013.01)

(56) References Cited

U.S. PATENT DOCUMENTS

| | | |
|---|---|---|
| 2017/0279160 A1* | 9/2017 | Kim .................... H01M 10/425 |
| 2019/0181418 A1 | 6/2019 | Son et al. |

* cited by examiner

FLEXIBLE PRINTED WIRING BOARD AND BATTERY WIRING MODULE

TECHNICAL FIELD

The present disclosure relates to a flexible printed wiring board and a battery wiring module. This application claims priority based on Japanese Patent Application No. 2019-128673 filed on Jul. 10, 2019. The entire contents of the description in this Japanese patent application are incorporated herein by reference.

BACKGROUND ART

In recent years, flexible printed wiring boards which are flexible and can be implemented compactly have attracted attention along with reduction in size and weight of electronic devices.

The flexible printed wiring board typically has another external element such as a battery connected thereto. Since the flexible printed wiring board and the other external element are mounted in an electronic device independently of each other, the distance between the flexible printed wiring board and the other external element changes due to vibration or the like of the electronic device. Accordingly, the flexible printed wiring board and the other external element are interconnected using an extra length absorbing portion which can extend and contract as the distance between the flexible printed wiring board and the other external element changes (or they displace).

As such an extra length absorbing portion, a structure has been proposed in which wiring is curved in an inverted U-shape and a spring member which absorbs an extra length and biases an extra length portion in a tensile direction is provided (see Japanese Patent Laid-Open No. 2005-192381). In this conventional extra length absorbing portion, when the wiring is tensioned, the extra length portion is pulled out, and the spring member is flexed and deformed and thus reduces stress concentration caused at a connecting portion due to tensile force. Further, when the conventional extra length absorbing portion is released from the tensile force, the pulled extra length portion is pulled back by elastic force caused as the spring member recovers from the flexure and hence deformation, and the pulled extra length portion thus returns to the original position.

CITATION LIST

Patent Literature

PTL 1: Japanese Patent Laid-Open No. 2005-192381

SUMMARY OF INVENTION

In one aspect of the present disclosure, a flexible printed wiring board comprises: an insulating base film; a conductive pattern disposed on one surface of the base film; and an extra length absorbing portion protruding from the base film and disposed in a direction of a plane for connecting the conductive pattern to an external element, the extra length absorbing portion including a pattern connected portion connected to the conductive pattern, a coupling portion having a first linear wiring portion, a first arcuate wiring portion, and a second linear wiring portion coupled in this order continuously from the pattern connected portion, and a connecting terminal connected to an end of the coupling portion that is opposite to an end of the coupling portion having the pattern connected portion coupled therewith, the pattern connected portion and the connecting terminal being opposite to each other in a direction in which the extra length absorbing portion protrudes, the first linear wiring portion and the second linear wiring portion being disposed in this order perpendicularly to the direction in which the extra length absorbing portion protrudes, the first arcuate wiring portion having opposite ends aligned in the direction in which the extra length absorbing portion protrudes, the first arcuate wiring portion having a central angle exceeding 180°, the first arcuate wiring portion having an inner diameter larger than an average spacing between the first linear wiring portion and the second linear wiring portion.

DETAILED DESCRIPTION

Figure 1:
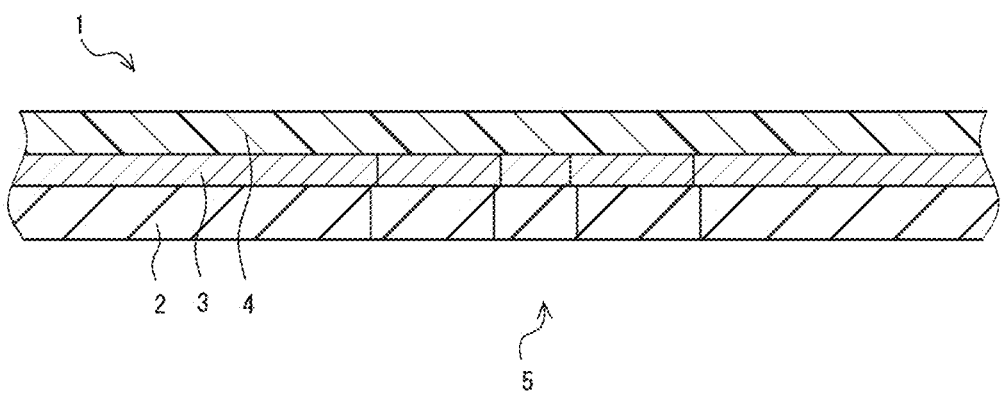
FIG. 1 is a schematic side view of a flexible printed wiring board according to an embodiment of the present disclosure.

Problem to be Solved by the Present Disclosure

However, the conventional extra length absorbing portion is relatively large because it is configured by using a spring member outside the flexible printed wiring board. Along with reduction in size and weight of electronic devices in recent years, the extra length absorbing portion is also required to be reduced in size. However, if the above structure is simply reduced in size, the stress concentration at the connecting portion cannot be sufficiently reduced, and the extra length absorbing portion may be broken.

The present disclosure has been made in view of such circumstances as described above, and contemplates a flexible printed wiring board having an extra length absorbing portion which is small in size and resistant to breakage, and reliable in connecting with an external element.

Advantageous Effect of the Present Disclosure

The presently disclosed flexible printed wiring board comprising an extra length absorbing portion that is small in size and resistant to breakage is reliable in connecting with an external element.

DESCRIPTION OF EMBODIMENTS OF THE PRESENT DISCLOSURE

In one aspect of the present disclosure, a flexible printed wiring board comprises: an insulating base film; a conductive pattern disposed on one surface of the base film; and an extra length absorbing portion protruding from the base film and disposed in a direction of a plane for connecting the conductive pattern to an external element, the extra length absorbing portion including a pattern connected portion connected to the conductive pattern, a coupling portion having a first linear wiring portion, a first arcuate wiring portion, and a second linear wiring portion coupled in this order continuously from the pattern connected portion, and a connecting terminal connected to an end of the coupling portion that is opposite to an end of the coupling portion having the pattern connected portion coupled therewith, the pattern connected portion and the connecting terminal being opposite to each other in a direction in which the extra length absorbing portion protrudes, the first linear wiring portion and the second linear wiring portion being disposed in this order perpendicularly to the direction in which the extra length absorbing portion protrudes, the first arcuate wiring portion having opposite ends aligned in the direction in which the extra length absorbing portion protrudes, the first arcuate wiring portion having a central angle exceeding 180°, the first arcuate wiring portion having an inner diameter larger than an average spacing between the first linear wiring portion and the second linear wiring portion.

The presently disclosed flexible printed wiring board comprises the extra length absorbing portion. The first linear wiring portion and the second linear wiring portion configuring the extra length absorbing portion are disposed perpendicularly to a direction in which the extra length absorbing portion protrudes, and the first arcuate wiring portion coupling the first linear wiring portion and the second linear wiring portion has an inner diameter larger than the average spacing between the first linear wiring portion and the second linear wiring portion. That is, the first arcuate wiring portion has an inner circumference expanded to be larger than the average spacing between the first linear wiring portion and the second linear wiring portion. As described above, the first arcuate wiring portion expanded to be larger than the average spacing between the first linear wiring portion and the second linear wiring portion can effectively reduce stress concentration caused at a connecting portion when stress acts. Thus the extra length absorbing portion of the flexible printed wiring board is resistant to breakage even when it is reduced in size. Thus the flexible printed wiring board is reliable in connecting with an external element.

A ratio of the inner diameter of the first arcuate wiring portion to the average spacing between the first linear wiring portion and the second linear wiring portion is preferably 1.1 or more and 4.0 or less. The first arcuate wiring portion having an inner diameter with a ratio in the above specified range can further effectively reduce stress concentration at a connecting portion while preventing the extra length absorbing portion from having a large size.

The first arcuate wiring portion preferably has an inner diameter of 0.5 mm or more and 10 mm or less. The first arcuate wiring portion having an inner diameter in the above specified range allows the extra length absorbing portion to be further reduced in size while maintaining effective reduction of stress concentration at a connecting portion.

It is recommendable that the coupling portion further include at least a second arcuate wiring portion and a third linear wiring portion coupled in this order continuously from the second linear wiring portion, the first linear wiring portion, the second linear wiring portion, and the third linear wiring portion be disposed in this order perpendicularly to and equidistantly in the direction in which the extra length absorbing portion protrudes, and the second arcuate wiring portion have an inner diameter larger than an average spacing between the second linear wiring portion and the third linear wiring portion. The coupling portion further including the second arcuate wiring portion provided so as to expand to be larger than the average spacing between the second linear wiring portion and the third linear wiring portion, and having the first linear wiring portion, the second linear wiring portion, and the third linear wiring portion at equal intervals, allows the extra length absorbing portion to be reduced in size widthwise, in particular, while maintaining effective reduction of stress concentration at a connecting portion.

The second linear wiring portion has a length preferably of 3 mm or more and 15 mm or less. The second linear wiring portion having a length within the above specified range allows the extra length absorbing portion to be further reduced in size while maintaining effective reduction of stress concentration at a connecting portion.

Herein, "arcuate wiring" means a wiring formed by cutting a portion of a circular wiring, and a "central angle" of an arcuate wiring means an angle formed by the center of a circle configuring an inner circumference of the arcuate wiring and the center of each end of the arcuate wiring, that is located on the side of the arcuate wiring. "The pattern connected portion and the connecting terminal being opposite to each other in a direction in which the extra length absorbing portion protrudes" means that there is a portion at which the pattern connected portion and the connecting terminal overlap each other, as seen in the direction in which the extra length absorbing portion protrudes.

Detailed Description of Embodiments of the Present Disclosure

Hereinafter, embodiments of the presently disclosed flexible printed wiring board will be described in detail with reference to the drawings.

First Embodiment

Figure 2:
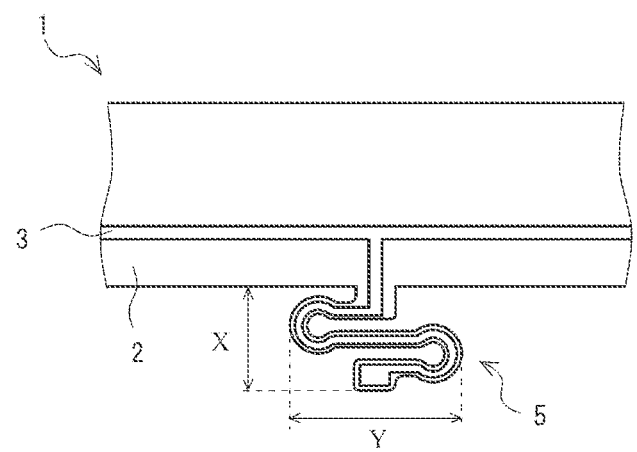
FIG. 2 is a schematic plan view of the FIG. 1 flexible printed wiring board with a coverlay removed therefrom.

As shown in FIGS. 1 and 2, a flexible printed wiring board 1 comprises a base film 2, a conductive pattern 3, a coverlay 4, and an extra length absorbing portion 5.

<Base Film>

Base film 2 is a member supporting conductive pattern 3, and is a structural member ensuring that flexible printed wiring board 1 has strength. Base film 2 is insulating and flexible.

Base film 2 can for example have as a major component thereof polyimide, a liquid crystal polymer represented by liquid crystal polyester, polyethylene terephthalate, polyethylene naphthalate, polyphenylene ether, fluororesin and other similar soft materials, paper phenol, paper epoxy, glass composite, glass epoxy, a glass substrate and other similar hard materials, a rigid flexible material obtained by compositing the soft material and the hard material, and the like. Inter alia, polyimide is preferable as it is excellent in heat resistance. Base film 2 may be porous or may contain a filler, an additive or the like. A "major component" as referred to herein indicates a component having a largest content, for example, a component having a content of 50% by mass or more.

While base film 2 is not particularly limited in thickness, base film 2 has an average thickness with a lower limit preferably of 5 μm, more preferably 12 μm. Base film 2 has the average thickness with an upper limit preferably of 500

µm, more preferably 200 µm. When the average thickness of base film 2 is less than the lower limit, base film 2 may be insufficient in strength. When the average thickness of base film 2 exceeds the upper limit, flexible printed wiring board 1 may be insufficiently flexible.

<Conductive Pattern>

Conductive pattern 3 is disposed on one surface of base film 2, and constitutes a structure such as an electric wiring structure, a ground, and a shield. In addition, conductive pattern 3 is normally also disposed on one surface of extra length absorbing portion 5 so as to be connectable to an external element.

While conductive pattern 3 is not particularly limited in what material it is formed of insofar as it is electrically conductive, the material includes metals such as copper, aluminum and nickel for example, and generally, copper is used as it is relatively inexpensive and has high conductivity. Conductive pattern 3 may have a plated surface.

Conductive pattern 3 has an average thickness with a lower limit preferably of 2 µm, more preferably 5 µm. Conductive pattern 3 has the average thickness with an upper limit preferably of 100 µm, more preferably 70 µm. When the average thickness of conductive pattern 3 is less than the lower limit, conductive pattern 3 may be insufficiently conductive. When the average thickness of conductive pattern 3 exceeds the upper limit, flexible printed wiring board 1 may be unnecessarily thick.

Conductive pattern 3 has an average width determined, as appropriate, depending on each structure such as an electronic component, an electric wiring structure, a ground, and a shield. Conductive pattern 3 has an average width with a lower limit preferably of 2 µm, more preferably 5 µm. Conductive pattern 3 has the average width with an upper limit preferably of 1 mm, more preferably 500 µm. When the average width of conductive pattern 3 is less than the lower limit, conductive pattern 3 may be insufficiently conductive. When the average width of conductive pattern 3 exceeds the upper limit, conductive pattern 3 is implemented less densely, which may make it difficult to mount electronic components at high density.

<Coverlay>

Coverlay 4 protects conductive pattern 3 against external force, moisture, and the like. Coverlay 4 has a cover film and an adhesive layer. Coverlay 4 has the cover film disposed via the adhesive layer on a surface of conductive pattern 3 opposite to base film 2.

Coverlay 4 is preferably also disposed on a surface of conductive pattern 3 disposed on one surface of extra length absorbing portion 5 described hereinafter. In addition, coverlay 4 is preferably also disposed throughout the periphery of a connecting terminal 53 of extra length absorbing portion 5. In other words, coverlay 4 on connecting terminal 53 of extra length absorbing portion 5 preferably has a shape to cover the entire surface of connecting terminal 53 and have an opening at the center thereof.

(Cover Film)

While the cover film is not particularly limited in what material it is formed of, the material can for example be similar to resin forming base film 2.

The cover film has an average thickness with a lower limit preferably of 5 µm, more preferably 10 µm. The cover film has the average thickness with an upper limit preferably of 50 µm, more preferably 30 µm. When the average thickness of the cover film is less than the lower limit, insulation may be insufficient. When the average thickness of the cover film exceeds the upper limit, flexible printed wiring board 1 may be impaired in flexibility.

(Adhesive Layer)

The adhesive layer fixes the cover film to conductive pattern 3 and base film 2. While the adhesive layer is not particularly limited in what material it is formed of insofar as it can fix the cover film to conductive pattern 3 and base film 2, it is preferably excellent in flexibility and heat resistance, and examples thereof include polyimide, polyamide, epoxy, butyral and acrylic. In addition, thermosetting resin is preferable from a viewpoint of heat resistance.

While the adhesive layer of coverlay 4 is not particularly limited in average thickness, it has an average thickness with a lower limit preferably for example of 5 µm, more preferably 10 µm. The adhesive layer has the average thickness with an upper limit preferably for example of 100 µm, more preferably 80 µm. When the average thickness of the adhesive layer is less than the lower limit, insufficient adhesion may be provided. When the average thickness of the adhesive layer exceeds the upper limit, flexible printed wiring board 1 may be impaired in flexibility.

<Extra Length Absorbing Portion>

Extra length absorbing portion 5 protrudes from base film 2 and is disposed in a direction of a plane. That is, extra length absorbing portion 5 protrudes from an end surface of base film 2, and is disposed such that one surface of base film 2 and one surface of extra length absorbing portion 5 are parallel to each other. Extra length absorbing portion 5 is provided for connecting conductive pattern 3 to an external element.

Flexible printed wiring board 1 shown in FIGS. 1 and 2 has extra length absorbing portion 5 integrally formed so as to protrude outward from an edge portion of base film 2. Thus integrally forming extra length absorbing portion 5 can prevent breakage between base film 2 and extra length absorbing portion 5.

Figure 3:
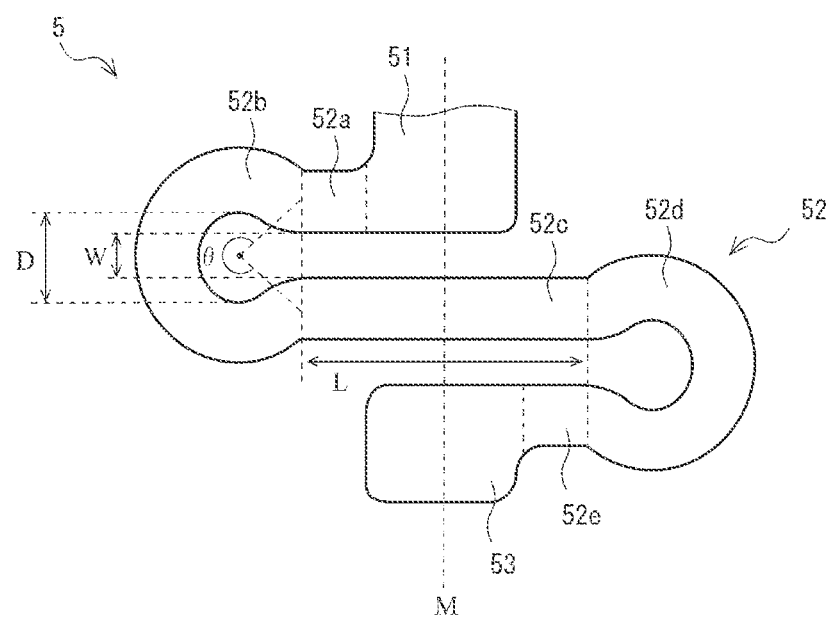
FIG. 3 is a schematic enlarged plan view of an extra length absorbing portion shown in FIG. 2.

As shown in FIG. 3, extra length absorbing portion 5 has a pattern connected portion 51 connected to conductive pattern 3 disposed on base film 2, a coupling portion 52 coupled to pattern connected portion 51, and connecting terminal 53 connected to an end portion of coupling portion 52 opposite to an end portion thereof having pattern connected portion 51 coupled thereto. In addition, coupling portion 52 has a first linear wiring portion 52a, a first arcuate wiring portion 52b, a second linear wiring portion 52c, a second arcuate wiring portion 52d, and a third linear wiring portion 52e that are coupled in this order continuously from pattern connected portion 51. Third linear wiring portion 52e is coupled to connecting terminal 53, and pattern connected portion 51 and connecting terminal 53 are configured to be opposite to each other in the direction in which extra length absorbing portion 5 protrudes.

In flexible printed wiring board 1 shown in FIGS. 1 and 2, extra length absorbing portion 5 is formed integrally with base film 2, as described above, and can have the same major component as base film 2. While extra length absorbing portion 5 may have an average thickness different than base film 2, it is preferable that the former is equal in thickness to the latter in view of strength of the former.

(Pattern Connected Portion)

Pattern connected portion 51 has a rectangular shape in plan view, and has as a shorter side a side extending in the direction in which extra length absorbing portion 5 protrudes. Pattern connected portion 51 may have chamfered corners as shown in FIG. 3.

Pattern connected portion 51 has a shorter side having a length larger than an average width of first linear wiring portion 52a. Pattern connected portion 51 has the shorter side with a lower limit in length preferably of 2 mm, more preferably 2.5 mm. Pattern connected portion 51 has the shorter side with an upper limit in length preferably of 5 mm, more preferably 4.5 mm. When pattern connected portion 51 has a shorter side having a length less than the lower limit, first linear wiring portion 52a may be unable to have a sufficient average width, and extra length absorbing portion 5 may be easily broken at coupling portion 52. When pattern connected portion 51 has a shorter side having a length exceeding the upper limit, it may be against a demand for reduction in size of extra length absorbing portion 5.

Pattern connected portion 51 has a longer side having a length smaller than that of second linear wiring portion 52c. Pattern connected portion 51 has the longer side with a lower limit in length preferably of 3 mm, more preferably 4 mm. Pattern connected portion 51 has the longer side with an upper limit in length preferably of 6.5 mm, more preferably 6 mm. When pattern connected portion 51 has a longer side having a length less than the lower limit, breakage may be easily caused between base film 2 and extra length absorbing portion 5. When pattern connected portion 51 has a longer side having a length exceeding the upper limit, it may be against a demand for reduction in size of extra length absorbing portion 5.

(Linear Wiring Portion)

First linear wiring portion 52a, second linear wiring portion 52c, and third linear wiring portion 52e are disposed in this order perpendicularly to and equidistantly in the direction in which the extra length absorbing portion protrudes.

First linear wiring portion 52a has one end coupled to one shorter side of pattern connected portion 51. First linear wiring portion 52a is preferably disposed to have one longitudinal peripheral side forming a straight line with a longer side of pattern connected portion 51. As first linear wiring portion 52a is thus provided, pattern connected portion 51 does not protrude beyond first linear wiring portion 52a in the direction in which extra length absorbing portion 5 protrudes, and extra length absorbing portion 5 can be easily reduced in size.

Second linear wiring portion 52c is disposed so as to have one end aligned with an end of first linear wiring portion 52a opposite to an end thereof coupled to pattern connected portion 51, as seen in the direction in which extra length absorbing portion 5 protrudes. Second linear wiring portion 52c is preferably disposed symmetrically with respect to a central axis M of pattern connected portion 51 in the direction in which extra length absorbing portion 5 protrudes. Thus disposing second linear wiring portion 52c can help reducing stress concentration irrespective of in whatever direction stress acts on a connecting portion.

Third linear wiring portion 52e is disposed so as to have one end aligned, as seen in the direction in which extra length absorbing portion 5 protrudes, with an end of second linear wiring portion 52c opposite to an end thereof coupled to second arcuate wiring portion 52d, which will be described hereinafter. Third linear wiring portion 52e has the other end coupled to connecting terminal 53.

Second linear wiring portion 52c has a length (denoted as "L" in FIG. 3) with a lower limit preferably of 3 mm, more preferably 5 mm, still more preferably 7 mm. Second linear wiring portion 52c has length L with an upper limit preferably of 15 mm, more preferably 10 mm. When length L of second linear wiring portion 52c is less than the lower limit, stress concentration at a connecting portion may be insufficiently effectively reduced. When length L of second linear wiring portion 52c exceeds the upper limit, it may be against a demand for reduction in size of extra length absorbing portion 5.

First linear wiring portion 52a and third linear wiring portion 52e are determined in length, as appropriate, depending on where pattern connected portion 51, first linear wiring portion 52a, and connecting terminal 53 are positioned. When second linear wiring portion 52c is disposed symmetrically with respect to central axis M of pattern connected portion 51 in the direction in which extra length absorbing portion 5 protrudes, it is preferable that first linear wiring portion 52a and third linear wiring portion 52e be equal in length. Equalizing first linear wiring portion 52a and third linear wiring portion 52e in length increases symmetry of extra length absorbing portion 5 with respect to central axis M and can thus help reducing stress concentration irrespective of in whatever direction stress acts on a connecting portion.

First linear wiring portion 52a and third linear wiring portion 52e have a lower limit in length preferably of 1 mm, more preferably 1.5 mm. First linear wiring portion 52a and third linear wiring portion 52e have an upper limit in length preferably of 7 mm, more preferably 5 mm. When first linear wiring portion 52a and third linear wiring portion 52e have a length less than the lower limit, stress concentration at a connecting portion may be insufficiently effectively reduced. When first linear wiring portion 52a and third linear wiring portion 52e have a length exceeding the upper limit, it may be against a demand for reduction in size of extra length absorbing portion 5.

First linear wiring portion 52a, second linear wiring portion 52c, and third linear wiring portion 52e have an average width with a lower limit preferably of 0.5 mm, more preferably 1 mm. The linear wiring portions have the average width with an upper limit preferably of 2.5 mm, more preferably 2 mm. When the average width of the linear wiring portions is less than the lower limit, extra length absorbing portion 5 may be easily broken at the linear wiring portions. When the average width of the linear wiring portions exceeds the upper limit, it may be against a demand for reduction in size of extra length absorbing portion 5.

Adjacent ones of first linear wiring portion 52a, second linear wiring portion 52c, and third linear wiring portion 52e have an average spacing (W in FIG. 3) therebetween with a lower limit preferably of 0.3 mm, more preferably 0.4 mm. Adjacent ones of first linear wiring portion 52a, second linear wiring portion 52c, and third linear wiring portion 52e have average spacing W therebetween with an upper limit preferably of 2.0 mm, more preferably 1.5 mm. When average spacing W between adjacent linear wiring portions is less than the lower limit, a sufficient inner diameter of an arcuate wiring portion, which will be described hereinafter, cannot be ensured, and stress concentration at a connecting portion may be insufficiently effectively reduced. When average spacing W between the adjacent linear wiring portions exceeds the upper limit, it may be against a demand for reduction in size of extra length absorbing portion 5.

(Arcuate Wiring Portion)

First arcuate wiring portion 52b and second arcuate wiring portion 52d each have opposite ends aligned in the direction in which extra length absorbing portion 5 protrudes. First arcuate wiring portion 52b has a center located on an extension of a straight line bisecting the spacing between first linear wiring portion 52a and second linear wiring portion 52c, and second arcuate wiring portion 52d has a center located on an extension of a straight line bisecting the spacing between second linear wiring portion 52c and third linear wiring portion 52e. First arcuate wiring portion 52b has a central angle (θ in FIG. 3) exceeding 180° and so does second arcuate wiring portion 52d. That is, first arcuate wiring portion 52b and second arcuate wiring portion 52d are provided so as to expand to be larger than the average spacing between first linear wiring portion 52a, second linear wiring portion 52c, and third linear wiring portion 52e.

While a portion connecting the arcuate wiring portion and the linear wiring portion together may connect them as they are, preferably it is chamfered so as to be smooth, as shown in FIG. 3. Thus making the connecting portion smooth can prevent extra length absorbing portion 5 from being broken at the connecting portion.

It is preferable that first arcuate wiring portion 52b and second arcuate wiring portion 52d have the same shape. First arcuate wiring portion 52b and second arcuate wiring portion 52d formed in the same shape can effectively reduce stress concentration caused at a connecting portion when stress acts.

First arcuate wiring portion 52b has central angle θ with a lower limit preferably of 190°, more preferably 200°. First arcuate wiring portion 52b has central angle θ with an upper limit preferably of 270°, more preferably 250°. When first arcuate wiring portion 52b has central angle θ less than the lower limit, stress concentration at a connecting portion may be insufficiently effectively reduced. When first arcuate wiring portion 52b has central angle θ exceeding the upper limit, first arcuate wiring portion 52b expands more with respect to average spacing W of the linear wiring portions, which may be against a demand for reduction in size of extra length absorbing portion 5.

First arcuate wiring portion 52b has an inner diameter (D in FIG. 3) with a lower limit preferably of 0.5 mm, more preferably 0.8 mm. First arcuate wiring portion 52b has inner diameter D with an upper limit preferably of 10 mm, preferably 4 mm, more preferably 3.5 mm. When inner diameter D of first arcuate wiring portion 52b is less than the lower limit, stress concentration at a connecting portion may be insufficiently effectively reduced. When inner diameter D of first arcuate wiring portion 52b exceeds the upper limit, it may be against a demand for reduction in size of extra length absorbing portion 5.

Inner diameter D of first arcuate wiring portion 52b is larger than average spacing W between first linear wiring portion 52a and second linear wiring portion 52c. A ratio of inner diameter D of first arcuate wiring portion 52b to average spacing W between first linear wiring portion 52a and second linear wiring portion 52c (i.e., D/W) is preferably 1.1, more preferably 1.2. The D/W has an upper limit preferably of 4.0, more preferably 3.5. When the D/W is less than the lower limit, stress concentration at a connecting portion may be insufficiently effectively reduced. When the D/W exceeds the upper limit, first arcuate wiring portion 52b expands more with respect to average spacing W of the linear wiring portions, which may be against a demand for reduction in size of extra length absorbing portion 5.

Second arcuate wiring portion 52d has an inner diameter larger than an average spacing between second linear wiring portion 52c and third linear wiring portion 52e. The central angle and inner diameter of second arcuate wiring portion 52d, and the ratio of the inner diameter of second arcuate wiring portion 52d to the average spacing between second linear wiring portion 52c and third linear wiring portion 52e can be similar to the central angle and inner diameter of first arcuate wiring portion 52b, and the ratio of the inner diameter of first arcuate wiring portion 52b to the average spacing between first linear wiring portion 52a and second linear wiring portion 52c, respectively.

The average width of first arcuate wiring portion 52b and second arcuate wiring portion 52d can be similar to the average width of first linear wiring portion 52a, second linear wiring portion 52c, and third linear wiring portion 52e. While the average width of first arcuate wiring portion 52b and second arcuate wiring portion 52d may be different from the average width of the linear wiring portions, preferably the former is equal to the latter. Thus equalizing the average width of the arcuate wiring portions and the average width of the linear wiring portions allows the arcuate wiring portions to have not only an inner circumference but also an outer circumference expanded with respect to the linear wiring portions, and can thus further effectively reduce stress concentration caused at a connecting portion when stress acts.

(Connecting Terminal)

Connecting terminal 53 has a rectangular shape in plan view, and has a shorter side extending in the direction in which extra length absorbing portion 5 protrudes. Connecting terminal 53 may have corners chamfered as shown in FIG. 3.

Connecting terminal 53 is preferably disposed such that a longer side thereof with respect to the direction in which extra length absorbing portion 5 protrudes continues to one longitudinal peripheral side of third linear wiring portion 52e. Connecting terminal 53 thus disposed does not protrude beyond third linear wiring portion 52e in the direction in which extra length absorbing portion 5 protrudes, and extra length absorbing portion 5 can be easily reduced in size.

Connecting terminal 53 has a shorter side having a length larger than an average width of third linear wiring portion 52e. Connecting terminal 53 has the shorter side with a lower limit in length preferably of 2 mm, more preferably 2.5 mm. Connecting terminal 53 has the shorter side with an upper limit in length preferably of 5 mm, more preferably 4.5 mm. When connecting terminal 53 has a shorter side having a length less than the lower limit, first linear wiring portion 52a may be unable to keep a sufficient average width, and extra length absorbing portion 5 may be easily broken at coupling portion 52. When connecting terminal 53 has a shorter side having a length exceeding the upper limit, it may be against a demand for reduction in size of extra length absorbing portion 5.

Connecting terminal 53 can have the longer side equal in length to that of pattern connected portion 51. While connecting terminal 53 may have a longer side different in length to that of pattern connected portion 51, it is preferable that the former has a longer side equal in length to that of the latter as this allows extra length absorbing portion 5 to be resistant to breakage and reduced in size.

Extra length absorbing portion 5 protrudes from an edge portion of base film 2 by a distance (that is, a distance, as seen in the direction in which extra length absorbing portion 5 protrudes, from an end portion of pattern connected portion 51 closer to base film 2 to an end portion of connecting terminal 53 opposite to base film 2, as denoted by X in FIG. 2) with a lower limit preferably of 4 mm, more preferably 5 mm. Extra length absorbing portion 5 protrudes by distance X with an upper limit preferably of 15 mm, more preferably 10 mm. When distance X is less than the lower limit, the linear wiring portions have an insufficient average width, and extra length absorbing portion 5 may be easily broken at the linear wiring portions. When distance X exceeds the upper limit, it may be against a demand for reduction in size of extra length absorbing portion 5.

Extra length absorbing portion 5 has a width (or a distance between an outer circumference of first arcuate wiring portion 52b and that of second arcuate wiring portion 52d in a direction perpendicular to the direction in which extra length absorbing portion 5 protrudes, denoted as Y in FIG. 2) with a lower limit preferably of 10 mm, more preferably 12 mm. Extra length absorbing portion 5 has width Y with an upper limit preferably of 25 mm, more preferably 20 mm. When width Y of extra length absorbing portion 5 is less than the lower limit, the linear wiring portions are short in length, and stress concentration at a connecting portion may be insufficiently effectively reduced. When width Y of extra length absorbing portion 5 exceeds the upper limit, it may be against a demand for reduction in size of extra length absorbing portion 5.

<Method for Manufacturing Flexible Printed Wiring Board>

Flexible printed wiring board 1 can be manufactured in a method for example comprising an extra length absorbing portion forming step, a conductive pattern forming step, and a coverlay disposing step.

(Extra Length Absorbing Portion Forming Step)

In the extra length absorbing portion forming step, extra length absorbing portion 5 is formed. Specifically, for example, when obtaining base film 2 from an original plate serving as a base material for base film 2, a die including that for extra length absorbing portion 5 is used to form extra length absorbing portion 5 together with base film 2 in one piece.

While extra length absorbing portion 5 may be obtained together with base film 2 in any method, it can be obtained in known methods such as punching through a die, dry etching away through plasma, or the like.

(Conductive Pattern Forming Step)

In the conductive pattern forming step, conductive pattern 3 is formed for example through the following procedure.

Initially, a conductor layer is formed on one surface of base film 2. The conductor layer can be formed for example by bonding a foil-shaped conductor with an adhesive, or by a known deposition technique. Examples of the conductor include copper, silver, gold, and nickel. The adhesive is not particularly limited insofar as it can bond the conductor to base film 2, and a variety of known adhesives can be used. Examples of the deposition technique include vapor deposition and plating. The conductor layer is preferably formed by bonding a copper foil to base film 2 using a polyimide adhesive.

Subsequently, the conductive layer is patterned to form conductive pattern 3. The conductor layer can be patterned in a known method such as photo-etching for example. Photo-etching is performed as follows: a resist film having a predetermined pattern is formed on one surface of the conductor layer, a portion of the conductor layer exposed from the resist film is treated with etchant, and the resist film is removed.

If necessary, conductive pattern 3 is also formed on a surface of extra length absorbing portion 5.

(Coverlay Disposing Step)

In the coverlay disposing step, coverlay 4 is disposed so as to cover conductive pattern 3.

Specifically, an adhesive layer is disposed on base film 2 with conductive pattern 3 formed thereon, and a surface of extra length absorbing portion 5, and a cover film is disposed on the adhesive layer. Alternatively, the adhesive layer may be disposed on the cover film in advance, and a surface of a side of the cover film on which the adhesive layer is disposed may be caused to face and thus bonded to conductive pattern 3.

Bonding the cover film with an adhesive can typically be done by thermal compression bonding. The thermal compression bonding may be done with temperature and pressure determined, as appropriate, depending on the type, composition, and the like of the adhesive used.

In some cases, an opening may be required in connecting terminal 53 of extra length absorbing portion 5, a portion of conductive pattern 3 at which an electronic component is mounted, and the like. In this case, the opening or the like is previously provided in coverlay 4 at a corresponding portion. Alternatively, the opening may be formed after coverlay 4 is disposed on base film 2 and conductive pattern 3.

<Advantages>

Flexible printed wiring board 1 comprises extra length absorbing portion 5. First linear wiring portion 52a and second linear wiring portion 52c configuring extra length absorbing portion 5 are disposed perpendicularly to a direction in which extra length absorbing portion 5 protrudes, and first arcuate wiring portion 52b coupling first linear wiring portion 52a and second linear wiring portion 52c has an inner diameter larger than an average spacing between first linear wiring portion 52a and second linear wiring portion 52c. First arcuate wiring portion 52b expanded to be larger than the average spacing between first linear wiring portion 52a and second linear wiring portion 52c can effectively reduce stress concentration caused at a connecting portion when stress acts. Thus extra length absorbing portion 5 of flexible printed wiring board 1 is resistant to breakage even when it is reduced in size. Thus flexible printed wiring board 1 is reliable in connecting with an external element.

Furthermore, flexible printed wiring board 1 comprises coupling portion 52 further including second arcuate wiring portion 52d provided so as to expand to be larger than the average spacing between second linear wiring portion 52c and third linear wiring portion 52e, and having first linear wiring portion 52a, second linear wiring portion 52c, and third linear wiring portion 52e at equal intervals, allows extra length absorbing portion 5 to be reduced in size widthwise in particular, while maintaining effective reduction of stress concentration at a connecting portion.

Second Embodiment

Figure 4:
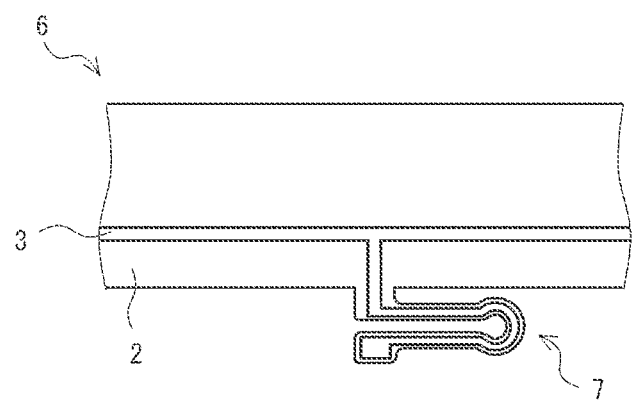
FIG. 4 is a schematic plan view of a flexible printed wiring board according to an embodiment different than FIG. 2.

FIG. 4 shows a flexible printed wiring board 6 according to an embodiment different from FIG. 2 of the present disclosure, that includes base film 2, conductive pattern 3, coverlay 4, and an extra length absorbing portion 7.

The configurations of base film 2, conductive pattern 3, and coverlay 4 in flexible printed wiring board 6 shown in FIG. 4 may be similar to that of base film 2, conductive pattern 3, and coverlay 4 in flexible printed wiring board 1 shown in FIG. 2, respectively. Flexible printed wiring board 6 shown in FIG. 4 can also be manufactured in a method similar to that employed to manufacture flexible printed wiring board 1 shown in FIG. 2. Accordingly, any component in flexible printed wiring board 6 shown in FIG. 4 that is identical to that of flexible printed wiring board 1 shown in FIG. 1 is identically denoted and will not be described repeatedly, and hereinafter, extra length absorbing portion 7 will be described.

<Extra Length Absorbing Portion>

Extra length absorbing portion 7 protrudes from base film 2 and is disposed in the direction of a plane. Extra length absorbing portion 7 is provided for connecting conductive pattern 3 to an external element. Extra length absorbing portion 7 is formed integrally with base film 2, as in flexible printed wiring board 1 shown in FIG. 2.

Extra length absorbing portion 7 has a pattern connected portion 71 connected to conductive pattern 3, a coupling portion 72 coupled to pattern connected portion 71, and a connecting terminal 73 connected to an end portion of coupling portion 72 opposite to an end portion thereof having pattern connected portion 71 coupled thereto. In addition, coupling portion 72 has a first linear wiring portion 72a, a first arcuate wiring portion 72b, and a second linear wiring portion 72c that are coupled in this order continuously from pattern connected portion 71. Second linear wiring portion 72c is coupled to connecting terminal 73, and pattern connected portion 71 and connecting terminal 73 are disposed opposite to each other in the direction in which extra length absorbing portion 7 protrudes.

(Pattern Connected Portion)

Figure 5:
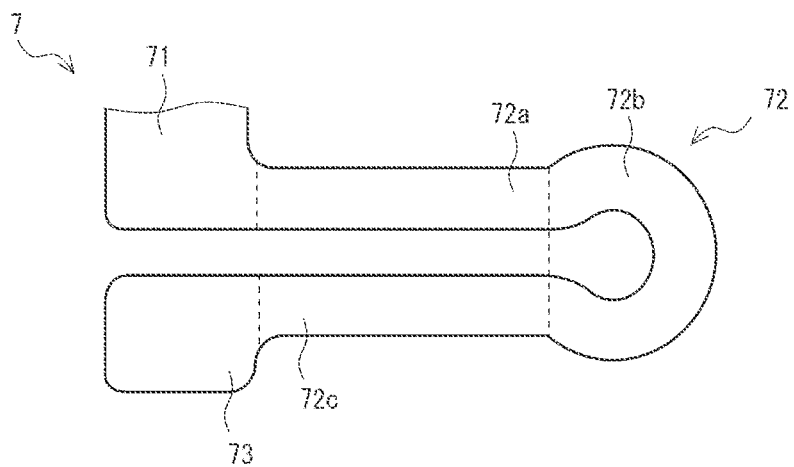
FIG. 5 is a schematic enlarged plan view of an extra length absorbing portion shown in FIG. 4.

Pattern connected portion 71 of flexible printed wiring board 6 shown in FIG. 5 can be configured in the same manner as pattern connected portion 51 of flexible printed wiring board 1 shown in FIG. 3, and accordingly, it will not be described repeatedly.

(Linear Wiring Portion)

First linear wiring portion 72a and second linear wiring portion 72c are disposed in this order perpendicularly to the direction in which the extra length absorbing portion protrudes.

First linear wiring portion 72a has one end coupled to one shorter side of pattern connected portion 71. First linear wiring portion 72a is preferably disposed to have one longitudinal peripheral side forming a straight line with a longer side of pattern connected portion 71. As first linear wiring portion 72a is thus provided, pattern connected portion 71 does not protrude beyond first linear wiring portion 72a in the direction in which the extra length absorbing portion protrudes, and extra length absorbing portion 7 can be easily reduced in size.

Second linear wiring portion 72c is disposed so as to have one end aligned, as seen in the direction in which extra length absorbing portion 7 protrudes, with an end of first linear wiring portion 72a opposite to an end thereof coupled to pattern connected portion 71. That is, first linear wiring portion 72a and second linear wiring portion 72c are equal in length.

The length of second linear wiring portion 72c of flexible printed wiring board 6 shown in FIG. 5 can be similar to the length of second linear wiring portion 52c of flexible printed wiring board 1 shown in FIG. 3. The average spacing between first linear wiring portion 72a and second linear wiring portion 72c of flexible printed wiring board 6 shown in FIG. 5 can be similar to the average spacing between first linear wiring portion 52a and second linear wiring portion 52c of flexible printed wiring board 1 shown in FIG. 3.

(Arcuate Wiring Portion)

First arcuate wiring portion 72b has opposite ends aligned in the direction in which the extra length absorbing portion protrudes, and first arcuate wiring portion 72b has a central angle exceeding 180°. First arcuate wiring portion 72b has an inner diameter larger than an average spacing between first linear wiring portion 72a and second linear wiring portion 72c.

Specifications of first arcuate wiring portion 72b of flexible printed wiring board 6 shown in FIG. 5 can similar to specifications of first arcuate wiring portion 52b of flexible printed wiring board 1 shown in FIG. 3, and accordingly, will not be described repeatedly.

(Connecting Terminal)

Connecting terminals 73 of flexible printed wiring board 6 shown in FIG. 5 can be configured to be similar to connecting terminal 53 of flexible printed wiring board 1 shown in FIG. 3, except that second linear wiring portion 72c is connected in place of third linear wiring portion 52e, and accordingly, it will not be described.

<Advantages>

Flexible printed wiring board 6 has only one arcuate wiring portion, and can be easily reduced in size particularly in the direction in which extra length absorbing portion 7 protrudes. In addition, first arcuate wiring portion 72b can have a relatively large inner diameter, and effective reduction of stress concentration at a connecting portion can be easily controlled.

Other Embodiments

It should be understood that the embodiments disclosed herein have been described for the purpose of illustration only and in a non-restrictive manner in any respect. The scope of the present invention is defined by the terms of the claims, rather than the configurations of the above embodiments, and is intended to include any modifications within the meaning and scope equivalent to the terms of the claims.

Figure 6:
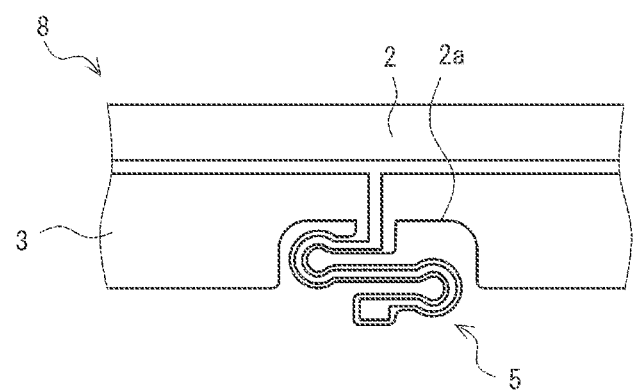
FIG. 6 is a schematic plan view of a flexible printed wiring board according to an embodiment different than FIGS. 2 and 4.

While in the above-described embodiments is described an example in which the extra length absorbing portion protrudes outward from an edge portion of the base film, for example as a flexible printed wiring board 8 has as shown in FIG. 6, a recess 2a may be provided in base film 2, and extra length absorbing portion 5 may be disposed such that a portion of extra length absorbing portion 5 is stored in recess 2a. Thus disposing extra length absorbing portion 5 allows flexible printed wiring board 8 to be further reduced in size.

Figure 7:
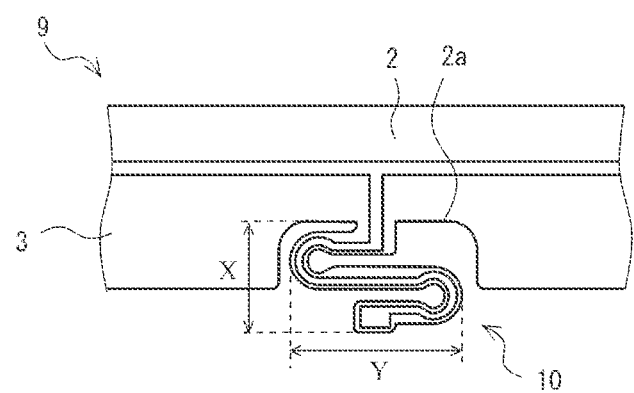
FIG. 7 is a schematic plan view of a flexible printed wiring board according to an embodiment different than FIGS. 2, 4 and 6.

While in the above-described embodiment is described an example in which the extra length absorbing portion includes an arcuate wiring portion expanded to be larger than a pair of linear wiring portions connected to the end portions of the arcuate wiring portion, as a flexible printed wiring board 9 shown in FIG. 7 comprises, an extra length absorbing portion 10 including an arcuate wiring portion having an outer circumference in the form of a semicircle is also intended by the present disclosure. Insofar as the first arcuate wiring portion has an inner diameter larger than the average spacing between the first linear wiring portion and the second linear wiring portion, effective reduction of stress concentration at a connecting portion can be achieved.

While in the first embodiment an example has been described in which the second arcuate wiring portion has an inner diameter larger than the average spacing between the second linear wiring portion and the third linear wiring portion, this configuration is not essential insofar as the first arcuate wiring portion has an inner diameter larger than the average spacing between the first linear wiring portion and the second linear wiring portion, and, for example, a second arcuate wiring portion having an inner diameter equal to the average spacing between the second linear wiring portion and the third linear wiring portion is also included in the present disclosure.

While in the first embodiment the coupling portion has two arcuate wiring portions and in the second embodiment the coupling portion has one arcuate wiring portion, the coupling portion may have three or more arcuate wiring portions. Even when the coupling portion has three or more arcuate wiring portions, each arcuate wiring portion has an end coupled to an end of another arcuate wiring portion by a linear wiring portion.

While in the above embodiments the conductive pattern is disposed only on one side of the base film, the conductive pattern may be disposed on opposite surfaces of the base film.

While in the above embodiments the flexible printed wiring board including the coverlay has been described, the coverlay is not an essential component and may be dispensed with. Alternatively, for example, an insulating layer having a different configuration may be used to cover one surface of the base film or the conductive pattern.

EXAMPLES

Hereinafter, the present disclosure will be described in more detail with reference to examples, although the present invention is not limited to thereto.

a direction perpendicular to the direction in which the extra length absorbing portion protrudes). The test was conducted for two cases, that is, the displacement had values of ±0.4 mm and ±0.8 mm with reference to the extra length absorbing portion when it was at rest.

During the relative sliding test, the resistance value of the pattern connected portion and the connecting terminal was monitored, and when it attained four times or more with reference to that when the test was started, the extra length absorbing portion was assumed to have broken, and the stroke count at that time was recorded. Note that when the extra length absorbing portion was slid and bent more than 10 million times for the displacement of ±0.4 mm and more than 10 million times for the displacement±0.8 mm and despite that there was no increasing resistance value observed, the test was terminated at that point in time. A result thereof is shown in Table 1.

TABLE 1

| | shape | No. 1 S | No. 2 U | No. 3 linear |
|---|---|---|---|---|
| displacement ±0.4 mm | variation in resistance | 0.3 Ω → 0.3 Ω | 0.3 Ω → 0.3 Ω | 0.4 Ω → 1.7 Ω |
| | stroke count | >10 million times | >10 million times | 6,528 |
| displacement ±0.8 mm | variation in resistance | 0.3 Ω → 0.3 Ω | 0.3 Ω → 0.3 Ω | 0.3 Ω → 1.8 Ω |
| | stroke count | >10 million times | >10 million times | 6,283 |

[No. 1]

A flexible printed wiring board having as the extra length absorbing portion extra length absorbing portion 5 in the form of the letter S as shown in FIG. 2 was prepared. The extra length absorbing portion had width X of 16 mm and protruded by distance Y of 17 mm.

The pattern connected portion and the connecting terminal each had a longer side of 4.5 mm and a shorter side of 2.5 mm. The arcuate wiring portion had an inner diameter of 2.0 mm and the linear wiring portions had an average width of 1.5 mm and an average spacing of 1.0 mm. The second linear wiring portion had a length of 9.0 mm.

[No. 2]

A flexible printed wiring board having as the extra length absorbing portion extra length absorbing portion 7 in the form of the letter U as shown in FIG. 4 in place of extra length absorbing portion 5 in the form of the letter S of No. 1 was prepared. The extra length absorbing portion had width X of 14 mm and protruded by distance Y of 14 mm. The pattern connected portion and the connecting terminal each had a longer side of 6.0 mm and a shorter side of 4.5 mm. The arcuate wiring portion had an inner diameter of 3.1 mm and the linear wiring portions had an average width of 1.45 mm and an average spacing of 1.00 mm. The second linear wiring portion had a length of 4.0 mm.

[No. 3]

Figure 8:
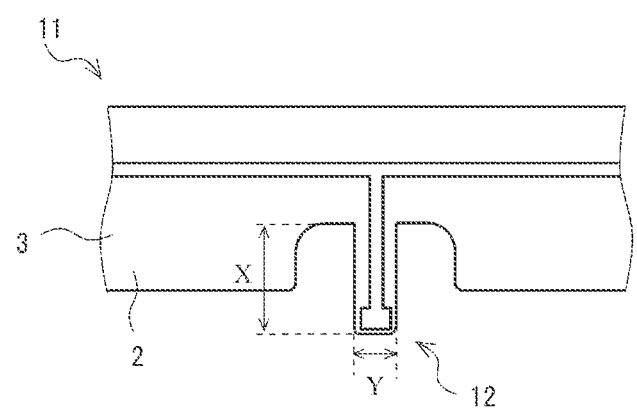
FIG. 8 is a schematic plan view of a flexible printed wiring board of No. 3 in an example.

A flexible printed wiring board 11 having as the extra length absorbing portion a linear extra length absorbing portion 12 as shown in FIG. 8 in place of extra length absorbing portion 5 in the form of the letter S of No. 1 was prepared. The extra length absorbing portion had width X of 10 mm and protruded by distance Y of 6 mm.

<Evaluation>

A relative sliding test was conducted as follows: a sliding and bending tester was used to continuously cause a constant displacement to the extra length absorbing portion of each of the flexible printed wiring boards of Nos. 1 to 3 in a direction along the width of the flexible printed wiring board (that is, In Table 1, for variation in resistance, a value before an arrow indicates a resistance value before the test and a value after an arrow indicates a resistance value after the test. For the displacement of ±0.4 mm and the displacement of ±0.8 mm, ">10 million times" means that there was no increasing resistance observed when the extra length absorbing portion was slid and bent 10 million times.

From the result shown in Table 1, it can be seen that the flexible printed wiring boards of No. 1 and No. 2 including the coupling portion having the first linear wiring portion, the first arcuate wiring portion, and the second linear wiring portion coupled in this order continuously from the pattern connected portion, with the first arcuate wiring portion having an inner diameter larger than the average spacing between the first linear wiring portion and the second linear wiring portion have an extra length absorbing portion more resistant to breakage and are more reliable in connecting with an external element than the flexible printed wiring board of No. 3 without having the first arcuate wiring portion.

Thus, the presently disclosed flexible printed wiring board comprising an extra length absorbing portion that is small in size and resistant to breakage is reliable in connecting with an external element.

(Battery Wiring Module)

Figure 9:
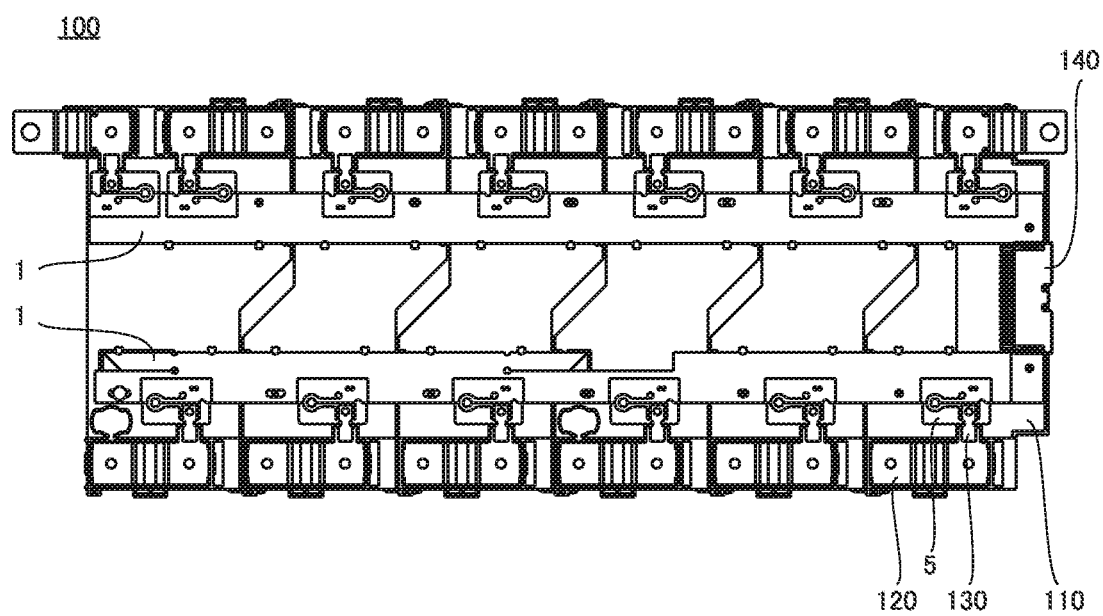
FIG. 9 is a plan view of a battery wiring module 100.

Hereinafter, a battery wiring module (hereinafter referred to as a "battery wiring module 100") in one aspect of the present disclosure will be described. FIG. 9 is a plan view of battery wiring module 100. As shown in FIG. 9, battery wiring module 100 comprises flexible printed wiring board 1, an insulating protector 110, a bus bar 120, a relay member 130, and a connector 140.

Insulating protector 110 is a plate-shaped member. Insulating protector 110 is formed of an insulating material. The insulating material is, for example, an insulating synthetic resin. Flexible printed wiring board 1 is mounted on an upper surface of insulating protector 110.

Bus bar 120 is a plate-shaped member formed of a conductive material. The conductive material is, for example, a metal material. Examples of the metal material include copper, a copper alloy, aluminum, an aluminum alloy, and stainless steel (SUS). Bus bar 120 is electrically connected to a power storage element (not shown). The power storage element is, for example, a secondary battery. Bus bar 120 connects any number of power storage elements in series or in parallel.

Relay member 130 is a plate-shaped member formed of a conductive material. The conductive material is, for example, a metal material. Examples of the metal material include copper, a copper alloy, aluminum, an aluminum alloy, stainless steel (SUS), nickel, and a nickel alloy. Relay member 130 electrically interconnects extra length absorbing portion 5 of flexible printed wiring board 1 and bus bar 120. Battery wiring module 100 may not include relay member 130. In this case, bus bar 120 is electrically connected to extra length absorbing portion 5 of flexible printed wiring board 1 without relay member 130 interposed. Battery wiring module 100 is electrically connected to an external device or the like by connector 140.

Thus flexible printed wiring board 1 is applicable to battery wiring module 100 attached to a power storage module including a power storage element. Although battery wiring module 100 has flexible printed wiring board 1 in the above example, flexible printed wiring board 1 may be replaced with flexible printed wiring board 6, flexible printed wiring board 8, or flexible printed wiring board 9.

REFERENCE SIGNS LIST

1, 6, 8, 9 11, flexible printed wiring board, 2 base film, 2a recess, 3 conductive pattern, 4 coverlay, 5, 7, 10, 12 extra length absorbing portion, 51, 71 pattern connected portion, 52, 72 coupling portion, 52a, 72a first linear wiring portion, 52b, 72b first arcuate wiring portion, 52c, 72c second linear wiring portion, 52d second arcuate wiring portion, 52e third linear wiring portion, 53, 73 connecting terminal, 100 battery wiring module, 110 insulating protector, 120 bus bar, 130 relay member, 140 connector.

The invention claimed is:

1. A flexible printed wiring board comprising:
   an insulating base film;
   a conductive pattern disposed on one surface of the base film; and
   an extra length absorbing portion protruding from the base film and disposed in a direction of a plane for connecting the conductive pattern to an external element,
   the extra length absorbing portion including
      a pattern connected portion connected to the conductive pattern,
      a coupling portion having a first linear wiring portion, a first arcuate wiring portion, and a second linear wiring portion coupled in this order continuously from the pattern connected portion, and
      a connecting terminal connected to an end of the coupling portion that is opposite to an end of the coupling portion having the pattern connected portion coupled therewith,
   the pattern connected portion and the connecting terminal being opposite to each other along a line extending in a direction in which the extra length absorbing portion protrudes,
   the first linear wiring portion and the second linear wiring portion being disposed in this order perpendicularly to the direction in which the extra length absorbing portion protrudes,
   the first arcuate wiring portion having opposite ends aligned in the direction in which the extra length absorbing portion protrudes, the first arcuate wiring portion having a central angle exceeding 180°,
   the first arcuate wiring portion having an inner diameter larger than an average spacing between the first linear wiring portion and the second linear wiring portion.

2. The flexible printed wiring board according to claim 1, wherein the first arcuate wiring portion has an inner diameter of 0.5 mm or more and 10 mm or less.

3. The flexible printed wiring board according to claim 1, wherein
   the coupling portion further includes at least a second arcuate wiring portion and a third linear wiring portion coupled in this order continuously from the second linear wiring portion,
   the first linear wiring portion, the second linear wiring portion, and the third linear wiring portion are disposed in this order perpendicularly to and equidistantly in the direction in which the extra length absorbing portion protrudes,
   the second arcuate wiring portion has opposite ends aligned in the direction in which the extra length absorbing portion protrudes and the second arcuate wiring portion has a central angle exceeding 180°, and
   the second arcuate wiring portion has an inner diameter larger than an average spacing between the second linear wiring portion and the third linear wiring portion.

4. The flexible printed wiring board according to claim 3, wherein the third linear wiring portion is connected to the connecting terminal.

5. The flexible printed wiring board according to claim 1, wherein the second linear wiring portion has a length of 3 mm or more and 15 mm or less.

6. The flexible printed wiring board according to claim 1, wherein the second linear wiring portion is connected to the connecting terminal.

7. A battery wiring module comprising the flexible printed wiring board according to claim 1, and attached to a battery module mounted in a vehicle.

\* \* \* \* \*